United States Patent [19]
Kuttner

[11] Patent Number: 6,014,020
[45] Date of Patent: Jan. 11, 2000

[54] REFERENCE VOLTAGE SOURCE WITH COMPENSATED TEMPERATURE DEPENDENCY AND METHOD FOR OPERATING THE SAME

[75] Inventor: Franz Kuttner, St. Ulrich, Austria

[73] Assignee: Siemens Aktiengesellschaft, Munich, Germany

[21] Appl. No.: 09/133,876

[22] Filed: Aug. 14, 1998

[30] Foreign Application Priority Data

Aug. 14, 1998 [DE] Germany ............................ 197 35 381

[51] Int. Cl.$^7$ ............................................. G05F 3/16
[52] U.S. Cl. ............................................ 323/317; 323/907
[58] Field of Search ................................ 323/317, 316, 323/907

[56] References Cited

U.S. PATENT DOCUMENTS 5,563,504  10/1996  Gilbert et al. ........................... 323/316

FOREIGN PATENT DOCUMENTS

| 0 661 616 A2 | 7/1995 | European Pat. Off. . |
| 0661616A2 | 7/1995 | European Pat. Off. . |
| 41 24 427 C2 | 6/1994 | Germany . |
| 4124427C2 | 6/1994 | Germany . |
| 2 111 223 | 6/1983 | United Kingdom . |
| 2 254 211 | 9/1992 | United Kingdom . |

OTHER PUBLICATIONS

U. Tietze et al.: "Halbleiterschaltungstechnik", 10$^{th}$ edition, Dec. 1994, p.558.

"Halbleiter–Schaltungstechnik", U. Teitze et al., 10$^{th}$ edition, Dec. 1994, pp. 662,663 and 558–601.

"CMOS Analog Design", Saunders College Pub., Dec. 1987, pp. 590–596.

*Primary Examiner*—Shawn Riley
*Attorney, Agent, or Firm*—Herbert L. Lerner; Laurence A. Greenberg

[57] ABSTRACT

A temperature-compensated bandgap reference voltage source with an operational amplifier and a switching device and a method of operating the bandgap reference voltage source. The operational amplifier has a first input stage with a first node carrying a potential and a second input stage with a second node carrying a potential. The first and second input stages provide an output signal of the operational amplifier. The switching device is connected and operated so as to selectively feed a first input signal and a second input signal alternately to the first input stage and to the second input stage, and to alternately select the output signal of the operational amplifier from the first node and from the second node.

11 Claims, 2 Drawing Sheets

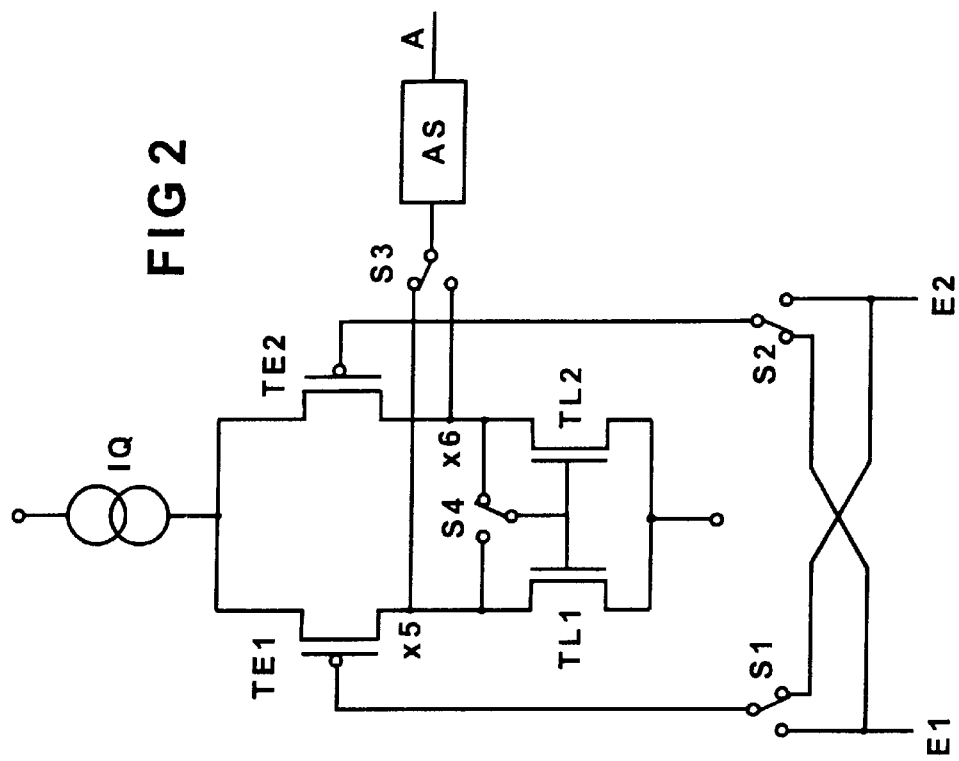
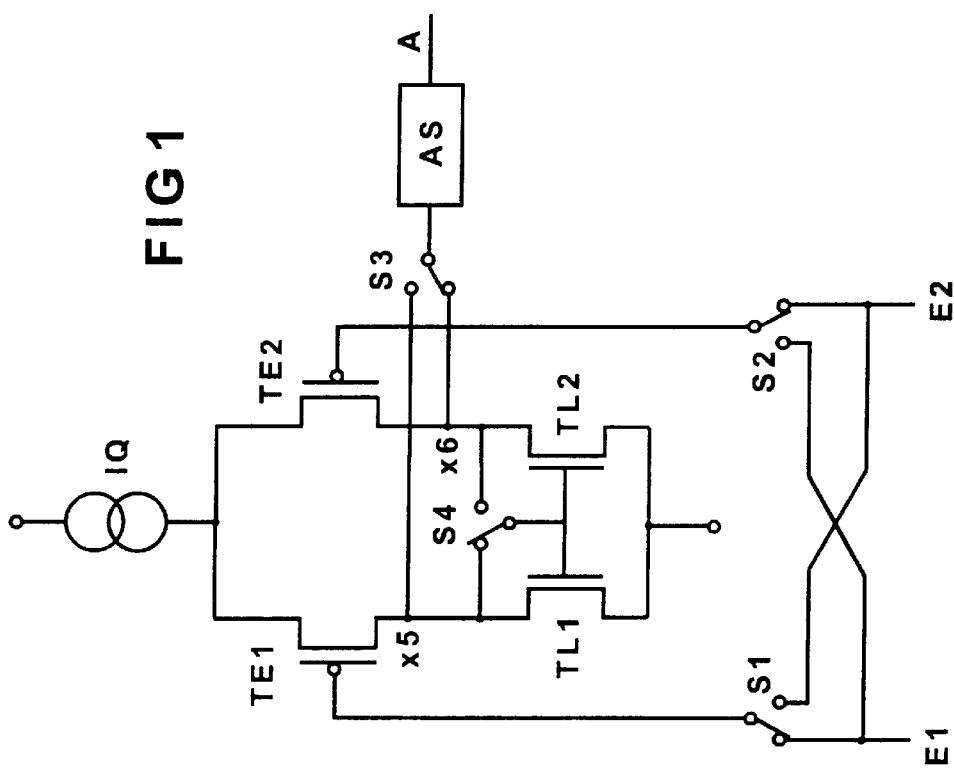

REFERENCE VOLTAGE SOURCE WITH COMPENSATED TEMPERATURE DEPENDENCY AND METHOD FOR OPERATING THE SAME

BACKGROUND OF THE INVENTION

FIELD OF THE INVENTION

The present invention relates to a bandgap reference voltage source with a temperature-compensating operational amplifier. The operational amplifier has a first input stage at which the potential of a first node is available, and a second input stage at which the potential of a second node is available. The invention also pertains to a method for operating such a bandgap reference voltage source.

Reference voltage sources of that type and their operation have been known for a long time. The principle behind these reference voltage sources is based on the fact that the base-emitter voltage of a bipolar transistor (or the forward voltage of a diode) is used as voltage reference. However, that voltage reference, the value of which is designated by $V_{BE}$ below, depends on the temperature to a relatively great extent. For example, at 0.6 V the temperature coefficient is approximately -2 mV/K. The temperature dependence can be compensated for if an appropriate temperature compensation voltage, designated as $KV_t$ below, is added to the voltage reference $V_{BE}$. This temperature compensation voltage is preferably generated and processed with the assistance of a second transistor and an operational amplifier.

The fundamental structure of such a configuration will now be explained with reference to FIG. 3.

The circuit of FIG. 3 comprises (bipolar) transistors T1 and T2, resistors R1, R2 and R3 and an operational amplifier OP. The interconnections of the elements are as shown.

The reference voltage $V_{ref}$ generated by the configuration is $$V_{ref} = V_{BE2} + KV_t$$

where $$K = \left(\frac{R_2}{R_1}\right) \ln\left(\frac{R_2 A_{E1}}{R_3 A_{E2}}\right)$$

and where $A_{E1}$ is the area of the emitter of the transistor T1 and $A_{E2}$ is the area of the emitter of the transistor T2.

Given suitable dimensioning of the individual components in the configuration according to FIG. 3, it is possible to make the temperature dependence of the reference voltage completely disappear.

In practice, however, it turns out to be considerably more complicated to generate the reference voltage $V_{ref}$ than may be presumed from the above simplified explanation. The virtually unavoidable offset of the operational amplifier is primarily responsible for this.

The offset of an operational amplifier is a known effect which arises when the operational amplifier has an asymmetrical structure, in other words, for example, when the input transistors of the operational amplifier have different sizes or the threshold voltages of these transistors are different; it acts like an (offset) voltage source connected upstream of one of the input terminals of the operational amplifier.

Due to the presence of the offset (of the offset voltage source), the reference voltage $V_{ref}$ generated by the configuration according to FIG. 3 becomes $$V_{re} = V_{BE2} - \left(1 + \frac{R_2}{R_1}\right)V_{OS} + \frac{R_2}{R_1}V_t \ln\left[\frac{R_2 A_{E1}}{R_3 A_{E2}}\left(1 - \frac{V_{OS}}{I_1 R_2}\right)\right]$$

Reference is had, with regard to this relationship, to P. E. Allen and D. R. Hollberg, "CMOS Analog Design", Saunders College Pub., 1987, pp. 590–596.

It is evident from the above formula, that the reference voltage is also influenced by the offset of the operational amplifier; the voltage $V_{os}$ of the equivalently introduced offset voltage source is present, in fact amplified by the factor 1+R2/R1, at the output of the operational amplifier.

Given customary dimensions an emitter area ratio of 10:1 is used for the transistors, as a result of which 1+R2/R1 must become approximately 10.5 if the temperature dependence of the reference voltage is to be eliminated (cf. Allen et al., above).

If an implementation of the bandgap reference voltage source in CMOS technology is presumed, and the offset of up to 30 mV which is customary in such cases, then the reference voltage, which normally amounts to about 1.2 V, would be corrupted by up to 0.315 V by the offset of the operational amplifier.

If the variation of the absolute value of the reference voltage is to be kept low, the offset must be compensated for.

For this purpose, provision could be made, for example, to trim the configuration individually in such a way that the respective offset is made to disappear. On account of the temperature dependence of the offset, however, such compensation is effective only at a quite specific temperature.

Another option in compensating for the offset consists in measuring the offset from time to time and correspondingly charging a capacitor which compensates for the offset. However, during the measurement and charging operation, the operational amplifier cannot be used as intended, as a result of which the reference voltage output by the operational amplifier can be output only with interruptions of greater or lesser duration. These interruptions occur repeatedly because the measurement and charging operation is necessary cyclically, in particular on account of discharge operations at the capacitor and on account of the temperature dependence of the offset. If a reference voltage is required which is available permanently without any interruptions, then such offset compensation is unsuitable or in any event not optimally suitable.

Another general discussion of bandgap reference voltage sources can be found for example in U. Tietze and Ch. Schenk, "Electronic Circuits: Design and Applications". Springer, Berlin, 1990; pp. 499–501 [cf. Halbleiterschaltungstechnik, $10^{th}$ Ed., 1994, pp. 558ff]. There, an operational amplifier is used for comparing two voltages which are proportional to the base-emitter voltages of two bipolar transistors. Another bandgap voltage reference is discussed in the European patent disclosure EP 0 661 616, where the voltage reference generated is fed to an amplifier having a high gain factor. The signal amplified in this way is fed to a voltage regulator which regulates the supply voltage of the circuit for the purpose of generating the bandgap voltage reference. Finally, German patent DE 41 24 427 describes a bandgap reference voltage source in which an improved independence with respect to temperature influences is achieved by setting a channel resistance ratio.

SUMMARY OF THE INVENTION

It is accordingly an object of the invention to provide a bandgap reference voltage source and a method of operating the same, which overcomes the above-mentioned disadvantages of the prior art devices and methods of this general type such that the bandgap reference voltage source is able to output an uninterrupted reference voltage which is compensated in terms of temperature and offset under all circumstances.

With the foregoing and other objects in view there is provided, in accordance with the invention, a bandgap reference voltage source that includes:

an operational amplifier provided particularly for temperature compensation having a first input stage with a first node carrying a potential and a second input stage with a second node carrying a potential, the first and second input stages outputting an output signal of the operational amplifier;

a switching device connected and operated so as to selectively feed a first input signal and a second input signal alternately to the first input stage and to the second input stage, and for selectively picking off the output signal of the operational amplifier from the first node and from the second node.

In accordance with an added feature of the invention, given substantially identical first and second input signals, the first input stage and the second input stage establish substantially identical potentials and/or potential profiles at the first node and the second node, respectively, as long as the circuit is operated in an error-free and interference-free state.

In accordance with an additional feature of the invention, a control device is connected to the switching device for cyclically actuating the switching device.

In accordance with another feature of the invention, the switching device is actuated according to a clock cycle that is constant over time and/or that has a symmetrical duty ratio.

In accordance with a further feature of the invention, a filter is provided for filtering from the output signal oscillations whose frequency corresponds to a switch-over clock frequency and integer multiples thereof. In accordance with a concomitant feature of the invention, an output stage receives an output stage input signal from the first and second nodes and outputs the output signal of the operational amplifier. The filter is connected to filter the output stage input signal or the output stage output signal.

With the above and other objects in view there is also provided, in accordance with the invention, a method of operating a bandgap reference voltage source of the type having an operational amplifier particularly for temperature compensation. The method comprises the following steps:

providing the operational amplifier with a first input stage with a first node at which a potential is available, and with a second input stage with a second node at which a potential is available;

defining a first state of the bandgap reference voltage source in which a first input signal is applied to the first input stage, a second input signal is applied to the second input stage, and/or an output signal of the operational amplifier is picked off at the second node, and a second state of the bandgap reference voltage source in which the first input signal is applied to the second input stage, the second input signal is applied to the first input stage, and/or the output signal is picked off at the first node; and cyclically switching the bandgap reference voltage source between the first state and the second state.

In other words, the bandgap reference voltage source contains a switching device which is designed in such a way that, by actuation of the switching device, the input signals of the operational amplifier or its input stages can be interchanged and/or the output signal of the operational amplifier can be generated optionally based on the potential of a node of a first input stage or the potential of a node of a second input stage. In the operating method, the bandgap reference voltage source is switched back and forth cyclically between two states. In the first state, the first input signal of the operational amplifier is fed to the first input stage of the same, the second input signal of the operational amplifier is fed to the second input stage of the same, and/or the output signal of the operational amplifier being generated based on the potential of a node of the second input stage, and in the second state the first input signal of the operational amplifier is fed to the second input stage of the same, the AO second input signal of the operational amplifier being applied to the first input stage of the same, and/or the output signal of the operational amplifier is generated based on the potential of a node of the first input stage.

Switching the switching device effects a variation, in terms of sign and/or magnitude, in the effects of the cause of the offset on the output signal of the operational amplifier, which carries the reference voltage that is to be generated.

If the switch-over is carried out repeatedly and the fluctuations in the output signal of the operational amplifier which are caused as a result are filtered out by a suitable filter (for example a low-pass filter), then what is obtained as a result is a reference voltage that is influenced to a lesser extent—or not at all—by the offset of the operational amplifier.

Consequently, the novel bandgap reference voltage source and method for operating the same make it possible, in a relatively simple manner, to generate, without any interruptions, a reference voltage that is temperature-compensated and offset-compensated under all circumstances.

Other features which are considered as characteristic for the invention are set forth in the appended claims.

Although the invention is illustrated and described herein as embodied in a bandgap reference voltage source and method for operating the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of part of the bandgap reference voltage source according to the invention that has central importance with regard to the offset compensation;

FIG. 2 is the circuit segment according to FIG. 1 in a switched-over state; and

DESCRIPTION OF THE PREFERRED EMBODIMENTS

Figure 3:
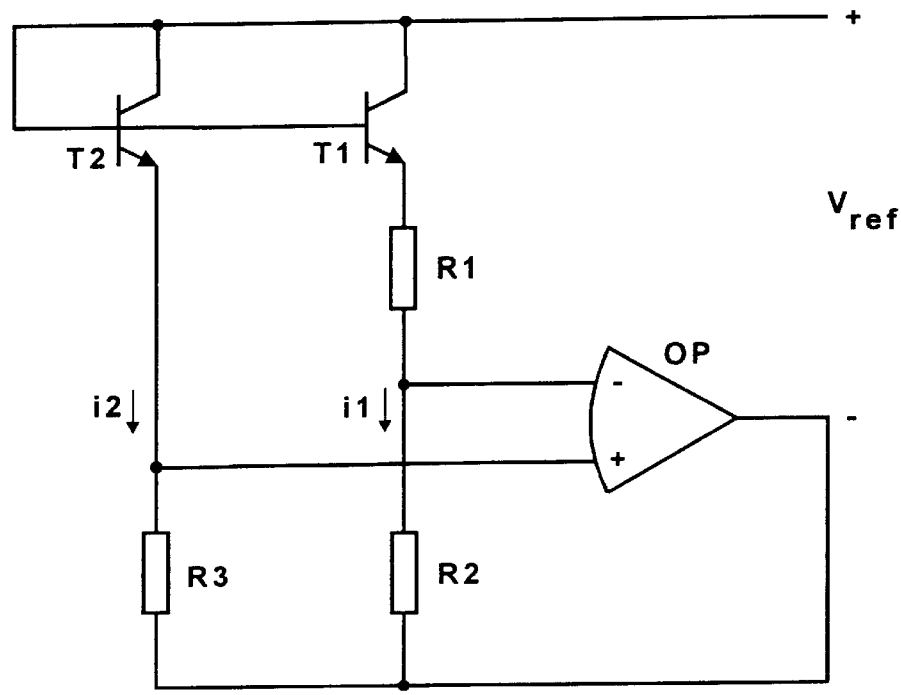
FIG. 3 shows the fundamental structure of a bandgap reference voltage source.

Referring now to the figures of the drawing in detail, there is seen a bandgap reference voltage source which is part of a CMOS circuit. The desired offset compensation is achieved by cyclically alternately establishing the states illustrated in FIGS. 1 and 2.

FIGS. 1 and 2 show parts of the operational amplifier and its supply lines and outgoing lines; those parts of the operational amplifier which are not important, or in any event not essentially important, for the following explanations are not illustrated in the figures, such as, for instance, the bias circuit and the startup circuit of the operational amplifier.

The operational amplifier shown receives a first input signal E1 and a second input signal E2. Its output is an output signal A.

The operational amplifier, to be more precise the illustrated part thereof, comprises first and second input transistors TE1 and TE2, first and second load transistors TL1 and TL2 and an output stage AS. The operational amplifier is supplied with power by a current source IQ.

The first input transistor TE1 and the first load transistor TL1 form a first input stage (an input stage for the first input signal), and the second input transistor TE2 and the second load transistor TL2 form a second input stage (an input stage for the second input signal). A first node x5 is located between the first input transistor TE1 and the first load transistor TL1, and a second node x6 is located between the second input transistor TE2 and the second load transistor TL2.

The input signals E1 and E2 are applied to the gate terminals of the input transistors TE1 and TE2, and the output signal is the signal which is output from the output stage.

In conventional bandgap reference voltage sources:
the first input signal E1 is applied to the gate terminal of the first input transistor TE1,
the second input signal E2 is applied to the gate terminal of the second input transistor TE2,
the potential of the node x6 of the second input stage is used as input signal of the output stage AS, and
the gate terminals of the load transistors TL1 and TL2 are connected to the node x5 of the first input stage.

This state is illustrated in FIG. 1.

Unlike in conventional bandgap reference voltage sources, this state is not permanent in the present bandgap reference voltage source. Rather, the novel concept repeatedly switches over between this state and a second state, illustrated in FIG. 2.

In the second state according to FIG. 2 (in contrast to the first state according to FIG. 1):
the first input signal E1 is applied to the gate terminal of the second input transistor TE2,
the second input signal E2 is applied to the gate terminal of the first input transistor TE1,
the potential of the node x5 of the first input stage is used as input signal of the output stage AS, and
the gate terminals of the load transistors TL1 and TL2 are connected to the node x6 of the second input stage.

As a result, the input signals of the operational amplifier or its input stages are thereby interchanged and the output signal of the operational amplifier is generated alternately based on the potential of the node x5 of the first input stage or the potential of the node x6 of the second input stage.

A switching device which is not present in conventional bandgap reference voltage sources is provided in order to switch over between the states shown in FIGS. 1 and 2. In FIGS. 1 and 2 the switching device is represented by switches S1, S2, S3 and S4, which, in a preferred practical embodiment, are transistors (transistor pairs). It is possible to switch back and forth between the states illustrated in FIGS. 1 and 2 by switching over the switches S1 to S4.

The switches S1 to S4 are assigned as follows:
the switch S1 serves to feed the first input signal E1 optionally either to the first input stage or to the second input stage,
the switch S2 serves to feed the second input signal E2 optionally either to the first input stage or to the second input stage,
the switch S3 serves to feed to the output stage AS as input signal optionally either the potential of the node x5 of the first input stage or the potential of the node x6 of the second input stage, and
the switch S4 serves to apply optionally either the potential of the node x5 of the first input stage or the potential of the node x6 of the second input stage as gate voltage to the load transistors TL1 TL2.

The input stages of the operational amplifier are designed in such a way that no systematic offset can occur. In other words, the individual elements of the input stages are provided and interconnected in such a way that—if there were no random asymmetry—in the steady-state condition of the configuration, in which, as is known, the input signals E1 and E2 have the same magnitude, the same source-drain voltages and gate voltages are established at the input transistors TE1 and TE2, on the one hand, and at the load transistors TL1 and TL2, on the other hand, as a result of which the nodes x5 and x6 are (would have to be) permanently at the same potential.

As noted above, random asymmetry in the input stages is virtually unavoidable and, accordingly, the potentials at the nodes x5 and x6 are precisely identical only in very rare cases. However, the differences which are present (and responsible for the occurrence of the offset) are so small that although the switching over from the state according to FIG. 1 to the state according to FIG. 2 gives rise to changes, this does not give rise to any, or at least any appreciable, transient processes in the output stage As and the output signal A thereof.

The output stage input signal which is picked off alternately at the node x5 and x6 and thus, in addition, the output signal A of the operational amplifier itself fluctuate with the timing of the switch-over. In this case, the output signal fluctuates between the temperature- and offset-compensated reference voltage desired value (approximately 1.2 V) plus the offset voltage and the reference voltage desired value minus the offset voltage.

This fluctuation occurs because the offset, as a result of the switch-over from the state according to FIG. 1 to the state according to FIG. 2 and vice versa (as a result of the interchanging of the nonidentical input stages), brings about in each case a variation, in terms of sign and/or magnitude, in the effects of the cause of the offset on the output signal A (the reference voltage to be generated).

If the fluctuations of the output signal are filtered out by a corresponding filter, then what is obtained as a result is a temperature- and offset-compensated (DC) output signal which has, or at least comes close to, the intended desired value of approximately 1.2 V.

In practice, such a filter is provided outside the operational amplifier. In principle, it may alternatively be provided within the operational amplifier, where it may filter either the output stage input signal or the output stage output signal or both signals.

The same applies similarly to the switches S1 to S4. They, too, or precisely the switching elements representing them, such as transistors and the like, may be provided, at least partly, either within or outside the operational amplifier.

The clock cycle within which the switches S1 to S4 are switched over preferably has a symmetrical duty ratio. The above-mentioned filter (for example a low-pass filter) should filter out in particular interference which is at the clock frequency or occurs at integer multiples of the clock frequency. Such filters are quite simple to implement (for example as RC filters).

In summary, success has been achieved, in a surprisingly simple manner, in creating a bandgap reference voltage source and a method for operating a bandgap reference voltage source which make it possible to generate, without any interruptions, a reference voltage which is compensated in terms of temperature and offset under all circumstances.

I claim:

1. A bandgap reference voltage source, comprising:

an operational amplifier having a first input stage with a first node carrying a potential and a second input stage with a second node carrying a potential, said first and second input stages outputting an output signal of said operational amp lifier; and a switching device connected and operated so as to selectively feed a first input signal and a second input signal alternately to said first input stage and to said second input stage, and to alternately select the output signal of said operational amplifier from said first node and from said second node.

2. The bandgap reference voltage source according to claim 1, wherein, given substantially identical first and second input signals, said first input stage and said second input stage establish substantially identical potentials and/or potential profiles at said first node and said second node, respectively, in an error-free and interference-free state.

3. The bandgap reference voltage source according to claim 1, which further comprises a control device connected to said switching device for cyclically actuating said switching device.

4. The bandgap reference voltage source according to claim 3, wherein said switching device is actuated according to a clock cycle that is constant over time.

5. The bandgap reference voltage source according to claim 4, wherein the clock cycle has a symmetrical duty ratio.

6. The bandgap reference voltage source according to claim 3, wherein said switching device is actuated according to a clock cycle with a symmetrical duty ratio.

7. The bandgap reference voltage source according to claim 1, which further comprises a filter for filtering oscillations whose frequency corresponds to a switch-over clock frequency and integer multiples thereof from the output signal.

8. The bandgap reference voltage source according to claim 7, which further comprises an output stage connected to receive an output stage input signal from said first and second nodes, and for outputting the output signal of said operational amplifier, and said filter being connected between said first and second nodes and said output stage.

9. The bandgap reference voltage source according to claim 7, which further comprises an output stage connected to receive an output stage input signal from said first and second nodes, and for outputting the output signal of said operational amplifier, and said filter being connected to filter the output stage output signal.

10. The bandgap reference voltage source according to claim 1, wherein said operational amplifier is provided primarily for temperature compensation.

11. A method of operating a bandgap reference voltage source of the type having an operational amplifier particularly for temperature compensation, the method which comprises:

providing the operational amplifier with a first input stage with a first node at which a potential is available, and with a second input stage with a second node at which a potential is available;

defining a first state of the bandgap reference voltage source in which a first input signal is applied to the first input stage, a second input signal is applied to the second input stage, and/or an output signal of the operational amplifier is obtained from the second node, and a second state of the, bandgap reference voltage source in which the first input signal is applied to the second input stage, the second input signal is applied to the first input stage, and/or the output signal is obtained from the first node; and cyclically switching the bandgap reference voltage source between the first state and the second state.

* * * * *